Figure 1:
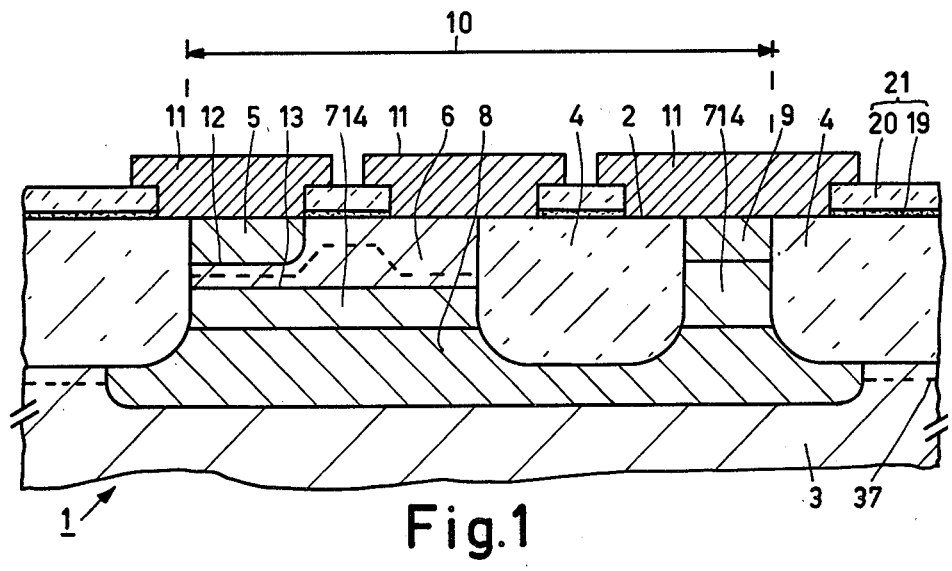

United States Patent [19]

van Gils

[11] 4,199,378

[45] Apr. 22, 1980

[54] METHOD OF MANUFACTURING A SEMICONDUCTOR DEVICE AND SEMICONDUCTOR DEVICE MANUFACTURED WHILE USING SUCH A METHOD

[75] Inventor: Johannes A. A. van Gils, Eindhoven, Netherlands

[73] Assignee: U.S. Philips Corporation, New York, N.Y.

[21] Appl. No.: 935,025

[22] Filed: Aug. 18, 1978

[30] Foreign Application Priority Data

Aug. 25, 1977 [NL] Netherlands .......................... 7709363

[51] Int. Cl.$^2$ ................... H01L 21/225; H01L 21/26; H01L 27/04
[52] U.S. Cl. ..................................... 148/1.5; 148/187; 357/44; 357/50; 357/91
[58] Field of Search ................. 148/1.5, 187, 175; 357/91, 44, 50

[56] References Cited

U.S. PATENT DOCUMENTS

| | | | |
|---|---|---|---|
| 3,928,091 | 12/1975 | Tachi et al. ............................ | 148/175 |
| 3,992,232 | 11/1976 | Kaji et al. ............................. | 148/175 |
| 3,996,077 | 12/1976 | Cornelis et al. ....................... | 148/187 |
| 4,008,107 | 2/1977 | Hayasaka et al. ..................... | 148/175 |
| 4,029,527 | 6/1977 | Glasl et al. ............................ | 148/187 |
| 4,045,249 | 8/1977 | Hotta ................................... | 148/1.5 |
| 4,066,473 | 1/1978 | O'Brien ................................. | 148/1.5 |
| 4,111,720 | 9/1978 | Michel et al. ......................... | 148/1.5 |

FOREIGN PATENT DOCUMENTS 1530010 10/1978 United Kingdom ..................... 148/1.5

OTHER PUBLICATIONS

Evans et al., "Oxide Isolated Ion Implanted-Transistor-," 1973, IEEE Int. Solid St. Circuit Conf., Philadelphia, 1973.
Graul et al., ". . . Double Implanted Transistors," IEEE J. Solid St. Circuit, vol. SC-10, (1971), 201.
Jambotkar, ". . . Bipolar Transistors," IBM-TDB, 19, (1977), 4601.

*Primary Examiner*—L. Dewayne Rutledge
*Assistant Examiner*—Upendra Roy
*Attorney, Agent, or Firm*—Thomas A. Briody; Jack Oisher; Steven R. Biren

[57] ABSTRACT

A method of manufacturing LOCOS transistors in which base doping, emitter doping and emitter metallization are provided via the same aperture. Problems at the edge of the sunken oxide are eliminated by a two-stage doping technique so that the channel stopper diffusion in the epitaxial layer may be omitted, which presents particular advantages in the manufacture of I$^2$L devices.

15 Claims, 17 Drawing Figures

METHOD OF MANUFACTURING A SEMICONDUCTOR DEVICE AND SEMICONDUCTOR DEVICE MANUFACTURED WHILE USING SUCH A METHOD

The invention relates to a method of manufacturing a semiconductor device having a semiconductor body comprising a circuit element, for example a transistor, having at least three zones situated one on top of the other and of alternate conductivity types, in which the semiconductor body is provided at a surface with a sunken oxide pattern which, viewed on the surface, bounds a surface-adjoining partial region of one conductivity type in which the circuit element is formed with a lowermost and uppermost zone of one conductivity type which, in the case of a transistor, constitute a collector zone and an emitter zone and an intermediate zone of the second conductivity type which, in the case of a transistor, constitutes a base zone and is separated from the lowermost and uppermost zones by p-n junctions which adjoin the sunken oxide pattern at least locally. The invention also relates to a semiconductor device manufactured using such a method.

A circuit element having at least three zones of alternate conductivity types situated one on top of the other is formed, for example, by a bipolar transistor having an emitter zone, a base zone and a collector zone. The uppermost zone usually forms the emitter zone, while the lowermost zone forms the collector. In certain cases, for example in circuit arrangements of the integrated injection-logic type (I²L), the functions of the emitter and collector may be interchanged, so that the uppermost zone forms the collector and the lowermost zone forms the emitter. In this case, several collector zones are usually provided per transistor in one base zone.

The said zones—in addition to forming part of transistors of the bipolar type—may also form part of other circuit elements, for example four-layer elements (p-n-p-n or n-p-n-p elements).

The partial region in which the circuit element is provided may consist, for example, of an island (in the case of an integrated circuit) formed in a surface layer of one conductivity type situated on a substrate of the opposite conductivity type on which the surface layer has been deposited, for example, by means of epitaxy.

The sunken oxide pattern may be provided in generally known manners by oxidation of the semiconductor body, the semiconductor body being masked locally against oxidation by, for example, a mask of silicon nitride.

A method of the above described kind is known inter alia from the published Netherlands Patent Application 7104496.

An important advantage of using a sunken oxide pattern resides in the fact that the zones and the p-n junctions between the zones are allowed to adjoin the sunken oxide directly. As a result of this very compact structures can be realized, at least more compact than those in which island isolation with reverse-biased p-n junctions is used instead of dielectric isolation. In this form, the p-n junctions between the zones of the circuit element are, as a matter of fact, situated at some distance from the island isolation. A semiconductor device having, for example, a transistor could be manufactured in the following manner. The starting material is a p-type semiconductor substrate which is locally provided with highly doped n-type surface zones at the area where buried collector layers are to be provided afterwards, or (in the case of an inverted transistor) a buried emitter region is to be formed. On the surface an n-type epitaxial layer is provided in which the sunken oxide pattern is formed by local oxidation, said pattern defining one or several island-shaped regions in the epitaxial layer. A p-type base may then be diffused or implanted in the island. An n-type emitter or, in the case of the inverted transistor, a collector region may then be provided in the base zone.

It has been found that short circuits may occur between the two outermost regions of the same conductivity type (emitter and collector). An important cause resides in the shape of the sunken oxide pattern. Since during the oxidation process the silicon is etched slightly to below the nitride mask, the thickness of the oxide gradually decreases at the edge of the oxide pattern. The junction between the p-type base and the lowermost n-type zone (for example the collector zone) hence terminates at, or at least very closely to, the surface of the semiconductor body. During a subsequent etching treatment, for example for opening the emitter window, the p-n junction may as a result become exposed or at least terminate so closely to the edge of the emitter window that a shortcircuit is produced between the emitter and the collector when the uppermost zone of one conductivity type (the emitter) is provided.

In order to avoid emitter-collector shorts, it has already been proposed in the above-mentioned Netherlands Patent Application to dope the surface parts of the semiconductor body which are not covered by the silicon nitride mask with a p-type impurity prior to performing the oxidation treatment. Said p-type impurity which, during provision of the sunken oxide pattern, diffuses into the p-type substrate and forms there a so-called channel stopper, also diffuses laterally and forms one or several p-type zones in the n-type epitaxial layer alongside the sunken oxide pattern. Said p-type zones can be insulated from the p-type substrate by means of highly doped buried n-type zones. By providing the base zone in such manner that said p-type zone adjoins the base zone, termination of the base-collector p-n junction at or near the surface of the body can be prevented.

In a number of cases it is desired to provide several mutually-isolated p-type (base) zones adjoining the sunken oxide pattern in an island, for example in the case of circuit arrangements of the integrated injection logic type. In this case each circuit unit comprises a p-n-p injection transistor and one or more n-p-n switching transistors. The switching transistors comprise a base zone of the p-type, which also forms the collector of a (lateral) injection transistor. The emitter and collector of said injection transistor must be mutually isolated and may therefore not adjoin a common p-type zone surrounding the sunken oxide pattern.

A further problem in the manufacture of transistors may be that during etching to form an emitter contact window, the emitter-base junction may become exposed, which junction may be shortcircuited during the subsequent provision of the contact metal.

It is an object of the invention to provide a method of the kind described above, in which doping windows and/or contact windows are manufactured in such manner that good passivation of the emitter-base junction and/or base-collector junction is ensured during the whole process.

The invention is inter alia based on the recognition that when a p-type zone is provided in a first n-type semiconductor zone via a window and then a second n-type zone is provided in the p-type zone, a short between the first and the second n-type zone can be prevented by providing the second n-type zone via the same window as the p-type zone without an intermediate etching step and down to a smaller depth than the p-type zone. The invention is further based on the recognition that, when in addition without an intermediate etching step a contact is provided on the second n-type zone via the same window, a short between the p-type zone and the second n-type zone is also prevented.

A method according to the invention is characterized in that after providing the sunken oxide pattern, a first doping step is carried out so as to obtain the intermediate zone, in which step a zone of the second conductivity type is formed in the partial region of one conductivity type the surface of which coincides entirely with that of the intermediate zone to be formed, after which a mask is provided on the surface of said zone which, together with the sunken oxide pattern, forms a window which defines a surface part of the zone of the second conductivity type adjoining the sunken oxide pattern, and a second doping step to obtain the intermediate zone is carried out, in which, at least via the above-mentioned window, the doping of at least a part of the zone of the second conductivity type is increased, and that via the said window the uppermost zone of one conductivity type of the circuit element is provided by doping with impurities causing this conductivity type down to a depth which is smaller than the depth of the part of the zone of the second conductivity type of which during the said second doping step the concentration is increased, and that via said window the uppermost zone of one conductivity type is contacted.

By using a method according to the invention, high quality transistors can be realized in a simple manner, in which a very compact structure is obtained due to the fact that the p-n junctions are allowed to adjoin the sunken oxide.

By means of the first doping step which is carried out uniformly over the whole base zone before the surface is provided with a masking layer with the emitter window, the thickness and the doping concentration of the extrinsic part of the base zone ultimately to be obtained have values which are desired for satisfactory operation of the transistor.

Since the second doping step is carried out after providing the surface with the mask comprising the emitter window and hence takes place at the area of and via said mask, shortcircuit problems which may occur in the known techniques, as described above, can be avoided in a simple manner. This means that no separate p+-zone need be provided along the edge of the sunken oxide (which in known methods is provided simultaneously with channel stoppers). As a result of this, several mutually-separated p-zones can be accommodated as such in one island, as is desired, for example, in I²L.

The mask which comprises the emitter window may also comprise the base contact window. In order to prevent the introduction of impurities causing the first conductivity type in the base zone via said base contact window during the emitter doping step, said base contact window may be covered. For this purpose, a preferred method according to the invention is characterized in that the above-mentioned mask, in addition to forming the window via which the uppermost zone of the first conductivity type is provided, forms, together with the sunken oxide pattern, a second window which forms a contact window for the base and for that purpose does not cover a second surface part of the zone of the second conductivity type adjoining the sunken oxide, which window is covered—during the provision of the uppermost zone of the first conductivity type—with a masking layer of a material which can be removed selectively with respect to the mask and the sunken oxide. The mask may consist, for example, of silicon oxide, i.e., of the same material as the material of the sunken pattern. The mask may alternatively consist of silicon nitride or of a combination of silicon nitride and silicon oxide. Silicon nitride presents several advantages such as selective etchability with respect to silicon and silicon oxide and favorable passivating properties. An extra advantage is that, if desired, it may serve as an etching stopper during etching via windows for a second level metallization pattern.

A further method in accordance with the invention is characterized in that a mask masking the semiconductor body against oxidation is provided on the surface of the body, after which the body is subjected to an etching treatment in which the said mask masking against oxidation forms an etching mask, and recesses are formed at the area of the exposed parts of the semiconductor body not covered by the mask masking against oxidation, and that the oxidation treatment to obtain sunken oxide pattern is then carried out, the said recesses being filled with oxide at least substantially entirely. This method is particularly suitable to provide so-called channel stoppers below the sunken oxide. For this purpose, a method in accordance with the invention is characterized in that the recesses extend down to below the mask masking against oxidation and that after providing said recesses, impurities of the second conductivity type are provided by means of ion implantation in a part of the recesses which is defined by projection of the parts of the mask masking against oxidation projecting over the edge of the recesses, and that said impurities, during the subsequent oxidation treatment to obtain the sunken oxide pattern, diffuse deeper in the body and, below the sunken oxide pattern, form a zone of the second conductivity type which, viewed on the surface, is situated below the sunken oxide pattern.

Figure 5:
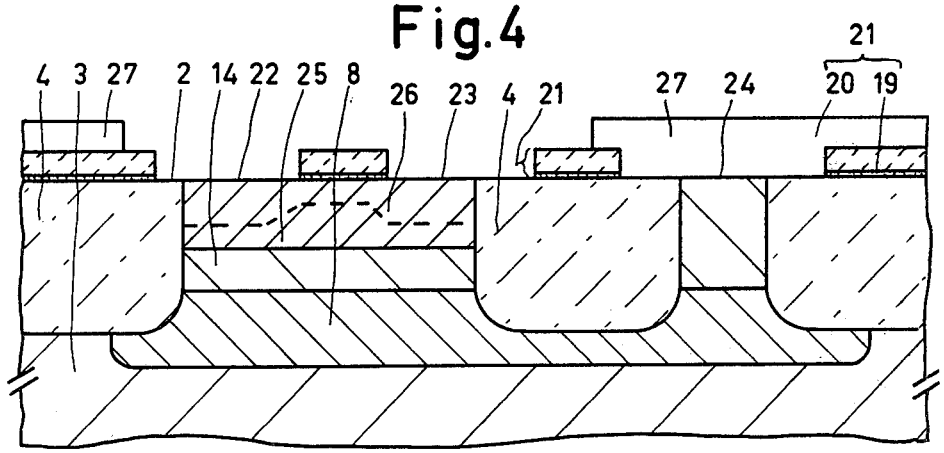
Figure 6:
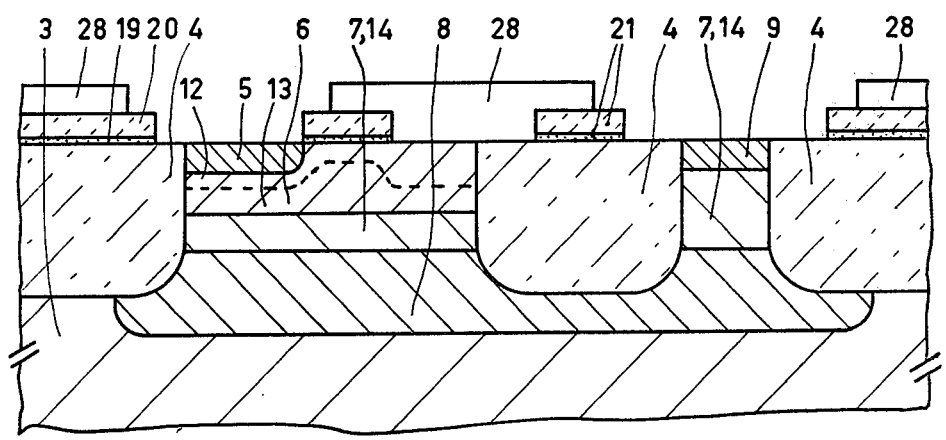
Figure 7:
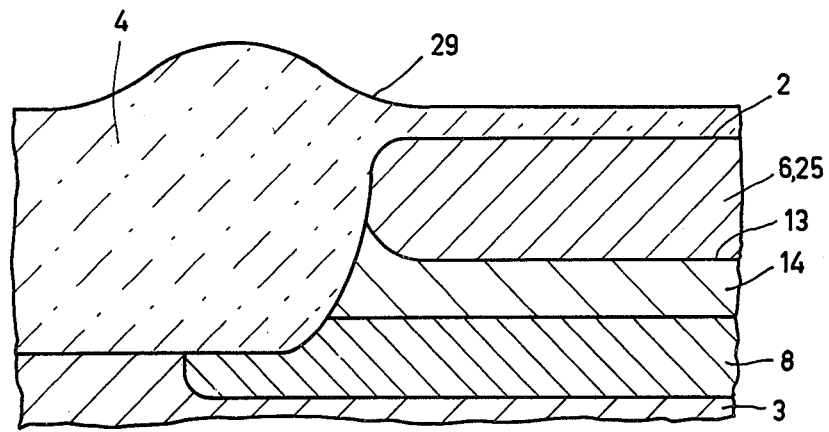
Figure 8:
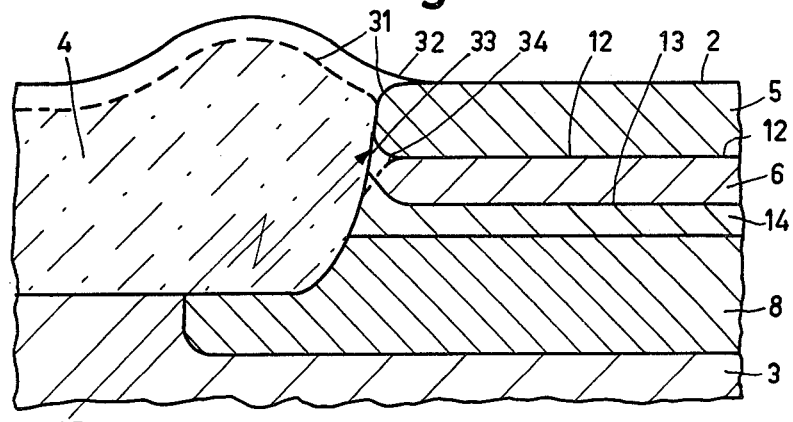
Figure 9:
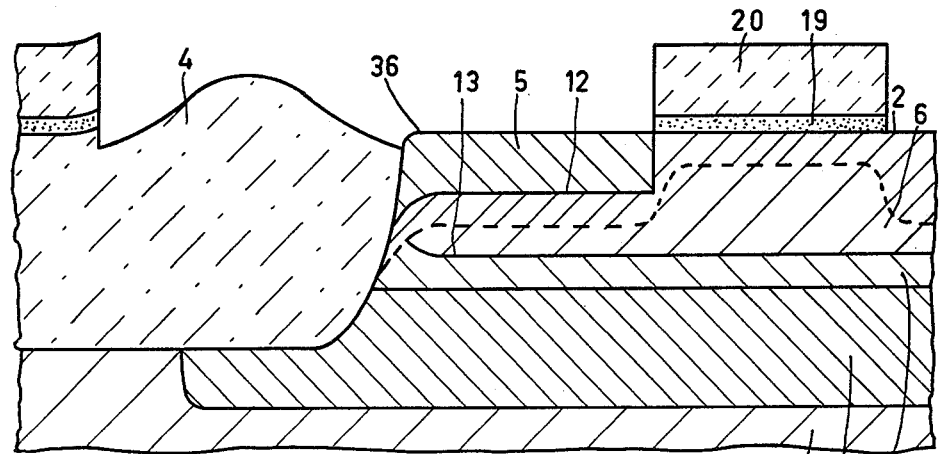
Figure 10:
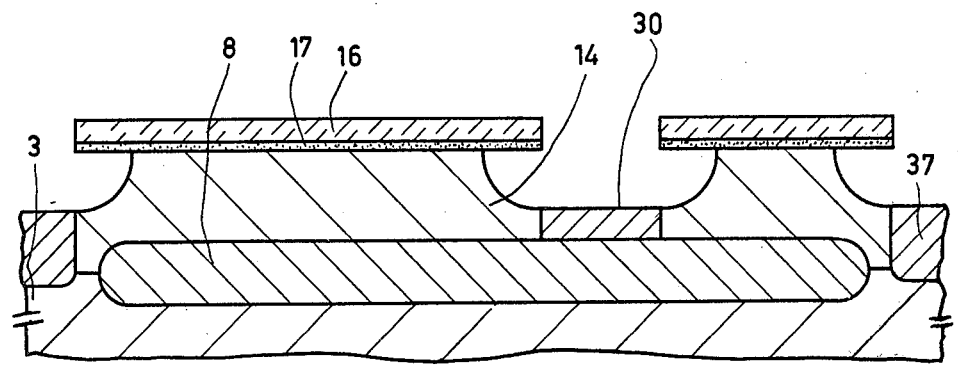
Figure 11:
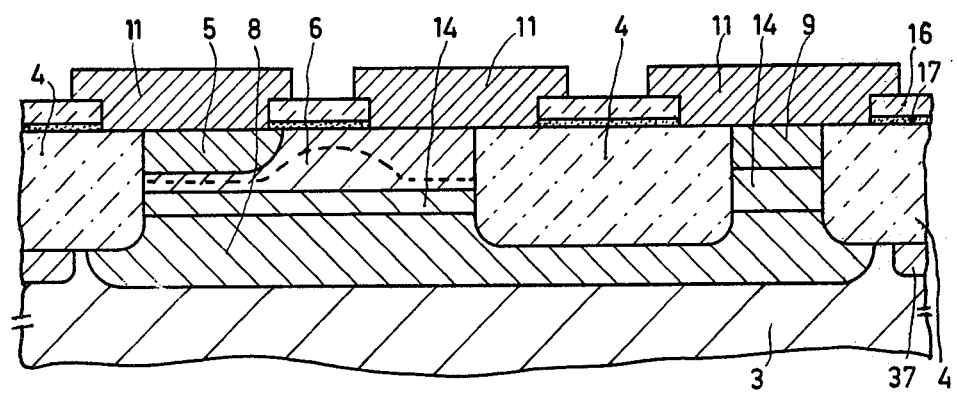
Figure 12:
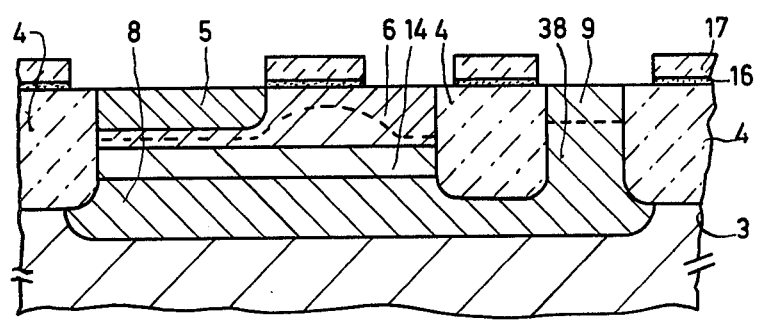
Figure 13:
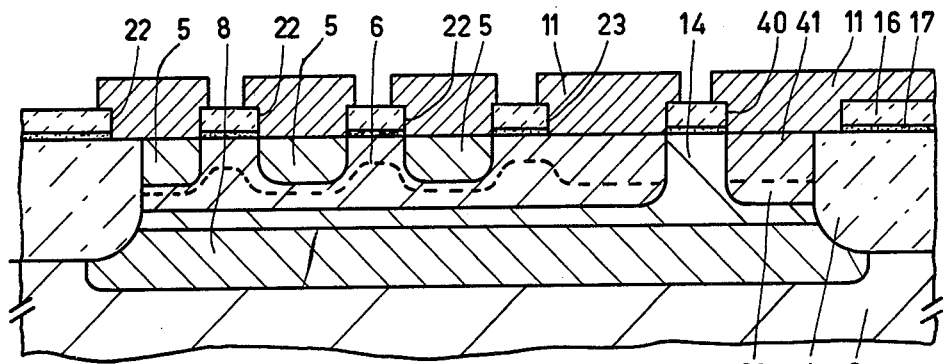
Figure 14:
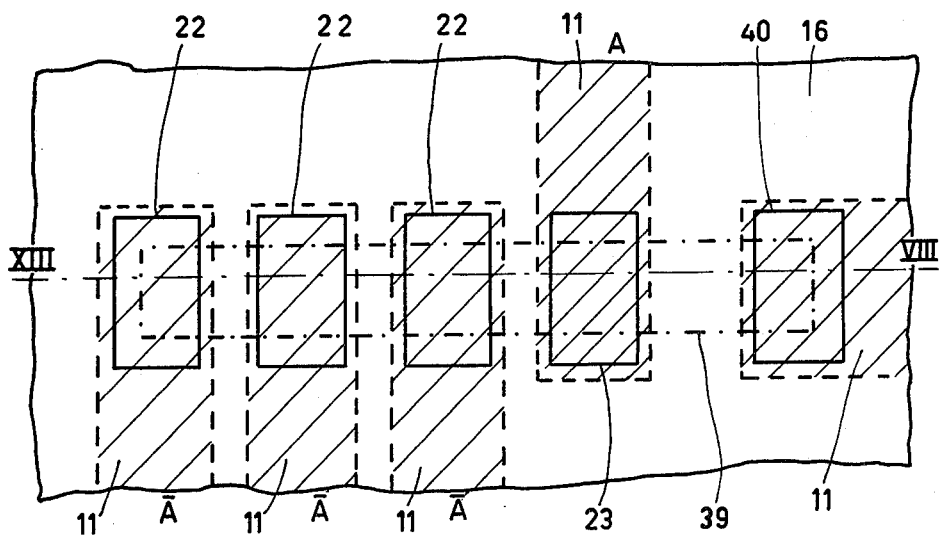
Figure 15:
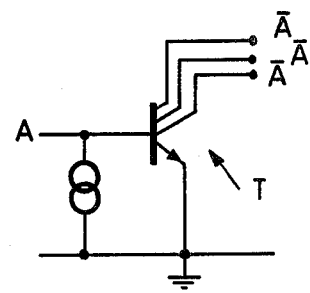
Figure 16:
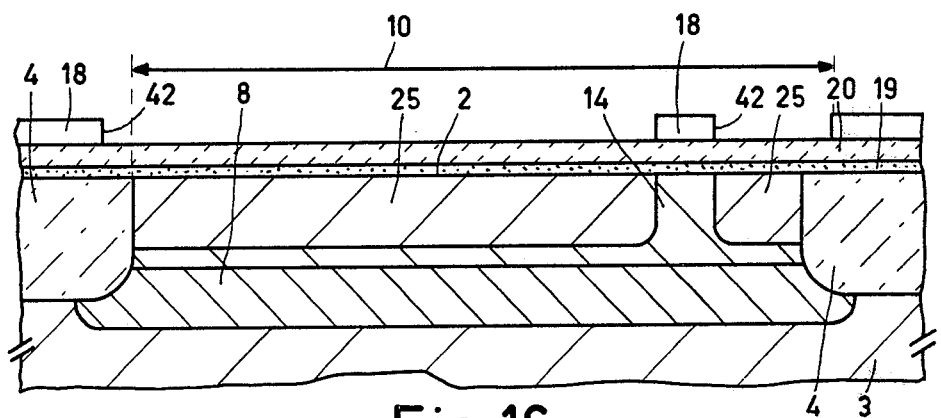
Figure 17:
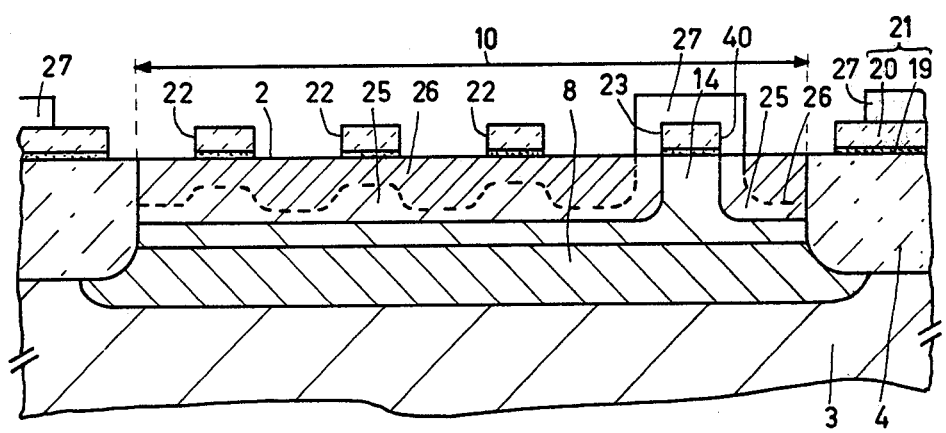

The invention will now be described in greater detail with reference to a few examples and the drawing, in which FIG. 1 is a cross-sectional view of a part of a semiconductor device manufactured by means of a method according to the invention, FIGS. 2–6 are cross-sectional views of the semiconductor device shown in FIG. 1 in successive stages of the method according to the invention, FIGS. 7 to 9 show details of a part of the semiconductor device shown in FIG. 1 (and of such a semiconductor device manufactured according to a known method), FIGS. 10 and 11 show stages of the manufacture by using a method according to the invention of a somewhat different device from that shown in FIG. 1, FIG. 12 is a cross-sectional view of another device manufactured according to the invention, FIG. 13 is a cross-sectional view of a further device manufactured in accordance with the invention, while FIG. 14 is a plan view thereof, FIG. 15 shows the electrical equivalent thereof, and FIGS. 16 and 17 are cross-sectional views of the device shown in FIG. 13 in various stages of the method according to the invention.

The Figures are diagrammatic and not drawn to scale and, for clarity, the dimensions in the thickness direction are exaggerated in the cross-sectional views. Semiconductor zones of the same conductivity type are shaded in the same direction; in the Figures, corresponding parts are generally referred to by the same reference numerals.

The device shown in FIG. 1 comprises a monocrystalline semiconductor body 1, in which in the partial region 10 a transistor is formed having an emitter zone 5, a base zone 6, and a collector zone 7 formed in a layer 14 (see FIG. 2) and thus designated 714 or 7,14. In order to reduce the collector resistance, a buried layer 8 is provided. The p-n junctions 12 and 13 which in this example form an emitter-base junction and a base-collector junction, respectively, adjoin at least partly the sunken oxide 4 which surrounds the transistor and also separates the collector contact zone 9 from the left-hand region in which the base and emitter are realized. The part of the device shown in FIG. 1 comprises only one transistor, but it will be obvious that the transistor may form parts of an integrated circuit in which several elements are realized in the common semiconductor body 1. Moreover, in this example the emitter, base and collector contact zones are provided with contact electrodes 11 extending to over the sunken oxide.

The device shown in FIG. 1 can be manufactured as follows (see FIGS. 2 to 6). Starting material is a p-type silicon substrate 3 whose resistivity is not critical but is, for example, between 1 and 100 Ohms.cm.

The thickness is approximately 250 micrometers. The lateral dimensions are assumed to be sufficiently large to be able to comprise the circuit.

Figure 2:
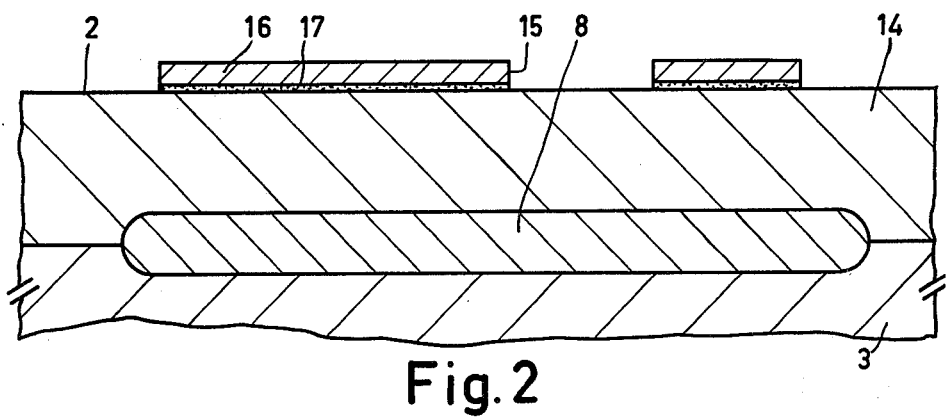
Figure 3:
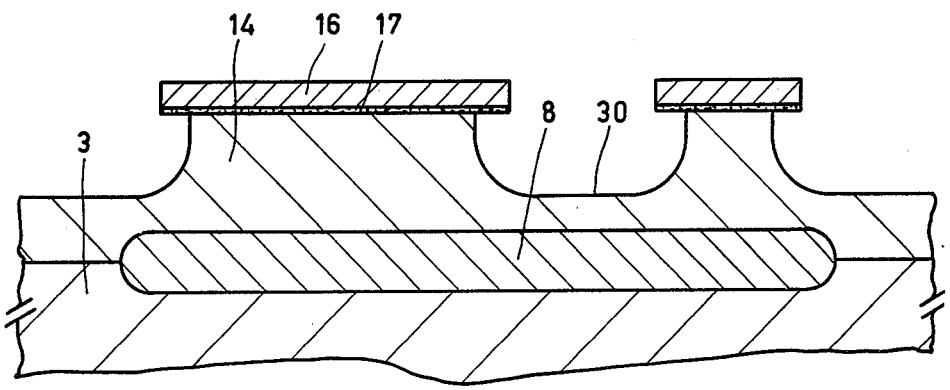

In known manner, for example, by diffusion, the surface of this body is provided with highly doped n-regions in the places where buried layers 8 are desired (FIG. 2). An n-type epitaxial layer having a thickness of approximately 2 micrometers is then grown on the substrate 3. During said growth and during further thermal treatments, the zone 8 can slightly expand in the epitaxial layer 14.

A masking layer having windows 15 is provided on the thus-obtained surface 2 of the epitaxial layer, said masking layer masking the underlying body against oxidation. Said mask is mainly formed by an approximately 1500 Å thick silicon nitride layer 16.

Preferably, however, prior to providing said layer 16, a very thin oxide layer 17 having a thickness of, for example 0.1 micrometer is provided on the surface 2. The nitride layer 16 can be obtained from silane ($SiH_4$) and ammonia ($NH_3$), while the oxide layer 17 is obtained, for example, by thermal oxidation.

Windows 15 are etched in the nitride layer 16 by means of phosphoric acid, or by means of plasma-etching. After removing the thin oxide, in so far as it is not covered by nitride, the silicon is subjected to an etching treatment in which the remaining nitride-oxide layer serves as a mask.

Figure 4:
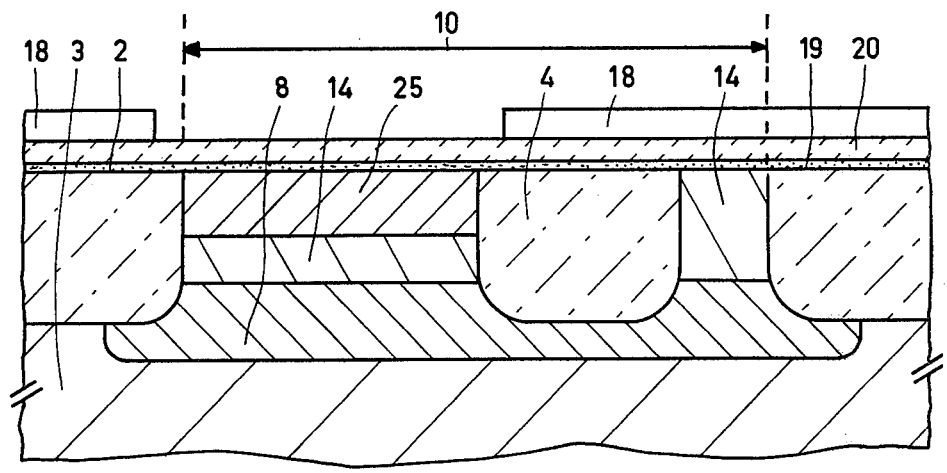

Etching is carried out, for example, by means of an etchant containing hydrofluoric acid, or by plasma-etching. Said etching treatment is continued down to a depth of, for example, approximately 1 micrometer (see FIG. 3), recesses 30 being formed. Using the nitride-oxide layer 16, 17 as a mask, the sunken oxide pattern 4 is then provided by local oxidation. The upward and downward growth rates of the oxide are approximately the same. This treatment is continued until the thickness of the sunken oxide pattern 4 is approximately 2 micrometers, so that a substantially smooth surface is obtained (FIG. 4). As shown in the figure, the sunken oxide extends into the buried layer 8. In this manner a semiconductor structure has been obtained in which the surface 2 is provided with the sunken oxide pattern 4. Said sunken oxide pattern 4 bounds a partial region 10 of one conductivity type, in this example an island which adjoins the surface 2 and which is divided into two parts by the central oxide strip, of which parts the one on the right hand, which is connected to the remainder of the island by means of the buried layer, is going to serve as a collector contact region. A circuit element is formed in said partial region, having in the left-hand part a lowermost and an uppermost zone of one conductivity type, the n-type, which forms a collector and an emitter zone of an n-p-n-transistor and an intermediate zone of the second conductivity type, the p-type, which forms a base zone of the n-p-n transistor.

The nitride-oxide mask 16, 17 already present on the surface 2 could, possibly, be used for the subsequent process steps. Preferably, said mask is removed after providing the sunken oxide pattern 4 and is replaced by a fresh oxide-nitride layer 19, 20 from which the ultimate passivating layers are to be formed. Moreover, said oxide-nitride layer 19, 20 is provided prior to the subsequent base doping, so as to prevent as much as possible out-diffusion from the base into the epitaxial layer. If desired, however, in particular in the manufacture of transistors having a large base width, the oxide-nitride layer 19, 20 might alternatively be provided after the subsequent base doping step.

The oxide layer 19 has a thickness of, for example, 400 Å while the nitride layer has a thickness of 1,000 Å.

In order to obtain the base zone, a first doping step is carried out in the left-hand part over the whole surface of the base zone to be formed of the second conductivity type which adjoins the sunken oxide on all sides. Although said doping step may be carried out by means of diffusion, ion implantation is used in the present case. Boron ions with an energy of, for example 60 KeV and a dose of $10^{14}$ atoms/sq. cm are implanted in the silicon down to a depth of approximately 0.2 $\mu$m. The p-type zone 25 is thus obtained, as shown in FIG. 4.

During the said implantation, the double layer 19, 20 is masked by means of a photo mask 18 having a window at the area of the partial region 10 and possible other regions where p-type zones are to be provided (FIG. 4). This mask does not require a critical alignment step because in fact the base window is already defined by the sunken oxide 4.

After the implantation, the photo mask 18 is removed and the double layer 19, 20 is subjected to an etching treatment so as to obtain a mask 21 which, together with the sunken oxide pattern 4, defines windows 22, 23, 24, in this example emitter-, base contact- and collector contact windows (FIG. 5). This mask 21 consists for the greater part of material which can be removed selectively with respect to silicon and the sunken oxide. As a result of this, said mask can be obtained by means of a non-critical photolithographic etching process. As will be described in detail hereinafter, the emitter window 22 will also form the emitter contact window.

The double layer 19, 20 at the area of the emitter window 22 and the base contact window 23, defense—together with the sunken oxide pattern 4—two surface parts of the zone 25 of the p-type adjoining the sunken oxide pattern, where the emitter and base contacts, respectively, are to be formed. A second p-type doping step to obtain the base zone is carried out via said windows. As a result of this, the concentration of a part of the zone 25, at least where the emitter is to be formed, is increased. In the present example the concentration is increased over the whole base zone. Said doping step is preferably carried out by means of ion implantation, for example with boron ions, which are implanted with an energy of, for example, 30 KeV with a dose of $5.10^{13}$ atoms/sq.cm. In this connection the advantage of ion implantation over diffusion is that those parts which need not be doped can be covered in a simple manner by means of a layer of photolacquer. Thermal treatments as a result of which the first base doping would out-diffuse further are generally not necessary. Moreover, ion implantation permits better control of the zone to be provided, as well as the doping concentration.

Since the zone 25 is covered partly with parts of the mask 21, the implantation will not occur uniformly over the whole base region; this is denoted diagrammatically by the broken line 26 in FIG. 5. However, this does not matter because the first base doping has taken place homogeneously over the whole surface. During said implantation, the window 24 as well as other parts of the semiconductor body, are protected by the photo mask 27 which is provided previously. Although this is not strictly necessary, the whole base region is left exposed by said mask, so that during the second doping step the concentration of impurities is increased over the whole surface of the p-type base zone. The advantage is a low base contact resistance and base series resistance, in addition to the prevention of emitter-collector shortcircuits to be described hereinafter.

After said doping step the photo mask 27 is removed and a photo mask 28 is provided which again leaves the window 22 exposed but covers the base contact window 23. This mask may be provided with wide tolerances with respect to the sunken oxide pattern 4 and the mask 21, the window 22 not varying with respect to the previous doping step. Moreover, the photo mask 28 leaves the collector contact window 24 open via which it is desired to provide impurities in the next doping step.

The semiconductor body is then doped with n-type impurities through the window 22. Again, this is preferably carried out by means of ion implantation, for example with arsenic ions with an energy of 60 KeV and a dose of $6.10^{15}$ atoms/sq.cm.

In view of the mass ratio of the ions used, said doping thus occurs to a depth which is smaller than the depth of the part of the p-type zone the concentration of which was increased during the previous step (second doping step). The emitter 5 is obtained in this manner, while the p-type zone forms the base 6 (FIG. 6). In this example, the collector-contact zone 9 is provided simultaneously with the emitter by means of the mask 28. After a subsequent annealing step at approximately 1,000° C., the p-n junctions 12 and 13 lie at approximately 0.25 μm and 0.4 μm, respectively.

After removing the photo mask 28, the emitter, the base and the collector are contacted via the same windows 22, 23, 24 in the mask 21, contact electrodes 11 being obtained (see FIG. 1).

In the above-described method, emitter-collector shorts and emitter-base shorts are avoided. These kinds of problems may occur at the edge of the sunken oxide in that, as a result of the so-called beak effect, the p-n junctions near said edge do not extend perfectly flat. This will be explained with reference to FIGS. 7 to 9.

As already described in Netherlands Patent Application 7104496, oxidation also occurs at the edge of the windows 15 below the silicon oxide layer 17 during the oxidation of the silicon body 1 (FIG. 3), as a result of which, after removing the nitride layer 16, an oxide pattern 4 is formed the shape of which is shown in FIG. 7. When the p-type zone 6,25 is then provided, the resulting p-n junction 13 will follow the profile 29 of the sunken oxide pattern 4 for the greater part (FIG. 7), so that the p-n junction 13 near the edge of said sunken oxide pattern has a slightly curved profile. When in a subsequent stage the silicon surface 2 is exposed, for example by means of a dip-etch in an etching mixture containing hydrofluoric acid, a part of the sunken oxide pattern can also be etched, as is shown diagrammatically in FIG. 8 by the broken line 31. When an n-type impurity to form the emitter is then provided via the thus exposed surface, the resulting p-n junction 12 will not follow the desired profile 32, but will follow this profile 31, and the rounding near the sunken oxide will not be curved according to the line 33, but according to the broken line 34, as a result of which collector and emitter can come in contact with each other. In a subsequent etching step for providing contact holes, the sunken oxide 4 may also be etched away to such an extent that one of the two p-n junctions 12, 13 becomes exposed and one of the said short-circuits may occur at the site 35 during a subsequent contacting step.

Said shortcircuits cannot occur in the method according to the invention because, after etching the thin layer of oxide, a second implantation follows which defines a p-region according to the profile 36 (FIG. 9) and after this etching treatment and subsequently without a further etching treatment the emitter is provided down to a smaller depth than the depth of said p-region and according to the same profile. As a result of this the p-n junction 12 is always at a distance from the p-n junction 13, while, as a result of the method, only the emitter zone is situated at the surface where it is contacted.

Another cause of emitter-collector leakage resides in the fact that, as a result of charge in the oxide, an n-channel can be induced along the oxide edge at the site 35 (FIG. 8); in general, the second implantation of the base zone has such a concentration that this form of leakage can also be prevented in a simple manner.

If desired, the device shown in FIG. 1 may be provided with channel stoppers below the sunken oxide, shown diagrammatically in FIG. 1 by the broken line 37. These zones can be obtained in a simple manner, for example, by increasing the doping concentration over the whole surface of the substrate 3 by means of ion implantation with a p-type impurity before carrying out further treatments, such as the provision of the epitaxial layer 14. The concentration in these channel stoppers is chosen to be so high that formation of channels below the sunken oxide pattern by which parts of the epitaxial layer might be connected together is prevented. It is to be noted that the provision of the channel-stopping zone, in contrast with the method described in the above-mentioned patent application 7,104,496 is not used to prevent the "beak effects" described, and hence has no detrimental influence on the base-collector capacitance or the base-collector breakdown voltage.

In a slightly different method, as illustrated in FIGS. 10 and 11, channel stoppers which do not adjoin the buried layer are provided between the circuit elements, as a result of which a further reduction of the stray capacity is advantageously obtained. In this method, again, recesses 30 are first etched, the mask 16, 17 masking against oxidation serving as an etching mask (FIG. 10). The recesses 30 extend to below this mask, so that parts of said mask 16, 17 project above the recesses and thus in projection leave a region exposed in which p-type impurities are provided by means of ion implantation. This is done, for example, by implanting boron ions with an energy of 30 KeV and a dose of $10^{14}$ atoms/sq.cm. As a result of this a p-type zone or region 37 of the same conductivity type as the substrate 3 is formed. During the subsequent provision of the sunken oxide 4, said region 37 expands by diffusion and a p-type zone having a higher doping than that of the substrate is obtained which, viewed on the surface, fully underlies the sunken oxide pattern 4 (FIG. 11). Said oxide pattern 4 preferbly extends through the epitaxial layer 14 into the substrate 3, while the doping of the region 37 is so high that formation of n-type channels below the sunken oxide pattern is prevented.

FIG. 12 shows an embodiment of a device manufactured while using a method according to the invention, in which the device is provided with a so-called collector wall 38, i.e. a deep collector contact zone which extends down to the buried layer 8. This is provided, for example, by means of diffusion, in which the left-hand part of the island 10 is covered by a masking layer. The advantage of the use of such a collector wall is that both doping steps of the second conductivity type, in this case the p-type, can be carried out over the whole surface of the island 10, hence also in the collector wall, provided the concentration of said p-type doping compared with that of the collector wall 38 and the collector contact zone 9 to be provided afterwards, is so low as to have no influence of the conductivity type.

Thus by using such a collector wall, the masks which in the preceding embodiments covered the collector contact may be omitted.

FIG. 13 is a cross-sectional view taken on the line XIII—XIII of the plan view shown in FIG. 14 of the part of a device manufactured while using a method according to the invention. In this case it relates to an inverter having 3 outputs of the integrated injection logic type the electrical equivalent of which is shown in FIG. 15.

The switching transistor T (FIG. 15) is formed by a multicollector n-p-n transistor which is inverted with respect to the transistors in the preceding embodiments. The input electrode A contacts, via the base-contact window 23, the p-zone 6 in which three n-zones 5 are provided which in this case serve as collectors and are contacted with the metallization pattern 11 via the contact windows 22, said parts forming the output tracks $\overline{A}$. The emitter of said n-p-n transistor is formed by the epitaxial layer 14 and the buried layer 8 which also form the n-type base of a lateral p-n-p transistor which ensures the injection current and is shown diagrammatically in FIG. 15 by means of a current source. The collector of said lateral p-n-p transistor is formed by the base zone 6 of the transistor T and the emitter by the p-zone 41. For a ground connection, a contact zone may be provided in the epitaxial layer, which zone contacts the emitter of transistor T and the base of the injection transistor via the buried layer 8. In the present example the said contact zone is not shown, which means to indicate that the said zone (epitaxial layer and buried layer) may be common to several circuit elements, so that a ground connection need not be made for each circuit element.

This device can be manufactured in substantially the same manner as those described in the preceding embodiments. By the use of the method according to the invention no p-zones along the edge of the sunken oxide are used, so that emitter and collector of a lateral transistor do not adjoin a common p-zone surrounding the sunken oxide.

In FIG. 14 the contact windows 22, 23 and 40 are denoted by solid lines, the metallization 11 is denoted by broken lines, while the edge 39 of the sunken oxide is denoted by a dot-and-dash line. It will inter alia be obvious that very compact structures can be realized due to the followed method by which the n-zones 5 are allowed to directly adjoin the sunken oxide.

FIGS. 16 and 17 show the device of FIG. 13 during the manufacture, respectively after the performance of the first doping step and the second doping step of the second conductivity type, in this example the p-type.

For performing the first doping step which has been carried out by means of implantation, the photomask 18 is used in which, unlike the base window in the first example, the holes 42 are defined already by the sunken oxide 4 but are also defined by said mask. The implantation is carried out again through the oxide-nitride layer 19, 20.

After performing the first doping step, the photo mask is removed and the double layer 19, 20 also is subjected again to an etching treatment so as to obtain a mask 21 which, together with the sunken oxide 4, defines collector contact windows 22, a base contact window 23 and an injector contact window 40. This mask may again consist for the greater part of material which can be removed selectively with respect to the silicon and the sunken oxide and can hence be provided by means of a non-critical photolithographic etching process. In this mask a window may be provided to the epitaxial layer for a contact zone to be provided afterwards for the above-mentioned ground connection. This latter window should be covered with a layer 27 of photolacquer during the second doping step of the p-type. This layer of photolacquer also covers those zones where the epitaxial layer 14 adjoins the surface 2 (FIG. 17).

Upon providing the collector doping via the collector contact window 22, the base contact window and the injector contact window 42 (emitter contact window of the p-n-p transistor) are covered by a layer of photolacquer, as well as those zones where the epitaxial layer 14 adjoins the surface 2 and no contact zones or other extra doping of the first conductivity type is desired. The underlying semiconductor zones are then contacted via the windows 22, 23, 40 and possible other contact windows.

It will be obvious that the invention is not restricted to the above-described embodiments but that many variations are possible to those skilled in the art without departing from the scope of this invention.

For example, the uppermost zone of the first conductivity type need not be provided fast as in the embodiments described, but said zone may alternatively be provided before carrying out the second doping step of the impurities causing the second conductivity type.

In the last embodiment, the layer 27 of photolacquer need not necessarily be provided at the area of the base of the p-n-p transistor (FIG. 17), provided the mask 21 is sufficiently thick at that area to avoid penetration of the arsenic atoms. Therefore, in this example the base doping in the region between the collectors 5 is not increased, but this need not be a disadvantage. The semiconductor body need not necessarily be silicon, but other semiconductor materials, for example silicon carbide, may alternatively be used. The conductivity type of all zones and regions may also be replaced (simultaneously) by the opposite conductivity type. Dependent on the desired electrical properties, the doping values may deviate from those mentioned here. If desired, the etching of the recesses 30 may be omitted. If in this case a flat surface is nevertheless desirable, then this may be obtained by temporarily interrupting the oxidation treatment and to remove the oxide already formed, after which the oxidation treatment is continued until the required depth has been reached. Instead of metal contacts, contacts in the form of polycrystalline silicon may alternatively be provided.

What is claimed is:

1. A method of manufacturing a semiconductor device having a semiconductor body comprising a circuit element having at least three zones of alternating conductivity type situated on top of one other and a sunken oxide pattern at the upper surface of said semiconductor body which bounds a surface-adjoining region containing said zones of alternating conductivity type, including upper and lower zones of a first type conductivity and an intermediate zone of a second type conductivity opposite to that of the first, said intermediate zone forming p-n junctions with said upper and lower zones, which zones extend to said sunken oxide pattern, the method comprising the steps of:
   providing the surface-adjoining region of a first type conductivity semiconductor material in said semiconductor body;
   providing the sunken oxide pattern at the upper surface of said semiconductor body and surrounding said surface-adjoining region;
   providing said intermediate zone of the second type conductivity in said surface-adjoining region in a first doping step;
   masking the surface of said intermediate zone to form a window which, together with the sunken oxide pattern, defines a surface part of the intermediate zone which adjoins the sunken oxide pattern;
   doping said intermediate zone at least through said window in a second doping step to increase the doping level of an upper portion of at least that part of the intermediate zone which adjoins the sunken oxide pattern;
   providing said upper zone of the first type conductivity through said window, in said upper portion of the intermediate zone which adjoins the sunken oxide pattern and down to a depth of less than that of said upper portion; and
   contacting said upper zone through said window.

2. A method of manufacturing a semiconductor device as in claim 1, wherein said circuit element comprises a transistor, the lower zone of said circuit element comprises the collector region of said transistor, the intermediate zone thereof comprises the base region of said transistor and the upper zone comprises the emitter zone of said transistor.

3. A method of manufacturing a semiconductor device as in claim 1, wherein said circuit element comprises a transistor, the lower zone of said circuit element comprises the emitter region of said transistor, the intermediate zone thereof comprises the base region of said transistor and the upper zone comprises the collector zone of said transistor.

4. A method as claimed in claim 1, wherein the upper zone is provided in the semiconductor body by means of ion implantation.

5. A method as claimed in claim 1, wherein the second doping step is carried out by means of ion implantation.

6. A method as claimed in claim 1, wherein the concentration of impurities in the second doping step is increased over the whole surface of the intermediate zone of the second conductivity type.

7. A method as claimed in claim 2, wherein said mask, in addition to forming the window through which the upper zone of the first type conductivity is provided, constitutes, together with the sunken oxide pattern, a second window which forms a contact window for the base region and leaves unmasked a second surface part of the intermediate zone of the second type conductivity adjoining the sunken oxide, which second window is covered, during the provision of the upper zone of the first type conductivity, with a masking layer of a material which can be removed selectively with respect to the mask and the sunken oxide.

8. A method as claimed in claim 1, wherein the mask comprises a layer of a material which can be removed selectively with respect to the sunken oxide.

9. A method as claimed in claim 8, wherein the mask comprises a layer of silicon nitride.

10. A method as claimed in claim 1, wherein the starting material in which the surface-adjoining material is provided is a substrate of the second type conductivity having a surface layer of the first type conductivity.

11. A method as claimed in claim 10, wherein the surface layer is an epitaxial layer.

12. A method as claimed in claim 1, wherein a mask masking the semiconductor body against oxidation is provided on the surface of the body, after which the body is subjected to an etching treatment in which said mask masking against oxidation forms an etching mask, recesses are formed at the area of the exposed parts of the semiconductor body not covered by the mask masking against oxidation, and the oxidation treatment to obtain the sunken oxide pattern is then carried out, said recesses being filled at least substantially entirely with oxide.

13. A method as claimed in claim 12, wherein the recesses extend down to below the mask masking against oxidation and, after providing said recesses, impurities of the second type conductivity are provided by means of ion implantation in parts of the recesses which are defined by the parts of the mask masking against oxidation which project over the edge of the recesses, and said impurities, during the subsequent oxidation treatment to obtain the sunken oxide pattern, diffuse deeper into the body and, below the sunken oxide pattern, form zones of the second type conductivity which, viewed on the surface, are situated entirely below the sunken oxide pattern.

14. A method as claimed in claim 13, wherein the sunken oxide pattern is provided over at least substantially the whole thickness of the surface layer and below the sunken oxide pattern a zone of the second type conductivity is formed which is situated entirely below the sunken oxide pattern and in the substrate of the second type conductivity and which has a sufficiently high doping level such that formation of channels of the first type conductivity below the sunken oxide pattern is prevented.

15. A semiconductor device manufactured by using a method as claimed in claim 1.

* * * * *